US006185233B1

(12) United States Patent
Moothart et al.

(10) Patent No.: US 6,185,233 B1
(45) Date of Patent: Feb. 6, 2001

(54) OUTPUT POWER CONTROLLED WAVELENGTH STABILIZING SYSTEM

(75) Inventors: Michael R. Moothart; John M. Dugan, both of Richardson, TX (US)

(73) Assignee: Alcatel

( * ) Notice: Under 35 U.S.C. 154(b), the term of this patent shall be extended for 0 days.

(21) Appl. No.: 09/328,035

(22) Filed: Jun. 8, 1999

(51) Int. Cl.$^7$ ........................................................ H01S 3/13
(52) U.S. Cl. .................. 372/32; 372/29.011; 372/29.015; 372/29.02; 372/38.01; 372/38.02
(58) Field of Search ........................... 372/29.01–29.023, 372/30–32, 38.1–38.02, 38.07

(56) References Cited

U.S. PATENT DOCUMENTS

| | | | |
|---|---|---|---|
| 4,689,795 | * 8/1987 | Yoshimoto et al. | 372/31 |
| 4,733,398 | * 3/1988 | Shibagaki et al. | 372/31 |
| 4,924,470 | * 5/1990 | Ries | 372/31 X |
| 5,867,514 | * 2/1999 | Anderson | 372/38.01 |

* cited by examiner

*Primary Examiner*—John D. Lee
(74) *Attorney, Agent, or Firm*—Gary Cary Ware & Freidenrich LLP

(57) ABSTRACT

A system and method for output power controlled stabilizing system comprises a wavelength limiter which minimizes the wavelength variation of a laser signal light. The wavelength limiter comprises a first and second clamping circuit. The first clamping circuit receives an offset voltage, compares the offset voltage to a first predetermined reference voltage, and outputs the voltage difference between the offset voltage and the first predetermined reference voltage. If the offset voltage rises higher than the first predetermined reference voltage, the first clamping circuit then clamps and keeps the power of the output power controlled wavelength stabilizing system from increasing. The second clamping circuit receives the offset voltage, compares the offset voltage to a second predetermined reference voltage, and outputs the voltage difference between the offset voltage and the second predetermined reference voltage. If the offset voltage drops below the second predetermined reference voltage, the second clamping circuit then clamps and keeps the power of the output power controlled wavelength stabilizing system from decreasing.

31 Claims, 2 Drawing Sheets

OUTPUT POWER CONTROLLED WAVELENGTH STABILIZING SYSTEM

TECHNICAL FIELD OF THE INVENTION

The present invention relates generally to a wavelength stabilizing system. In particular, this invention relates to a system and method for minimizing the wavelength variation at the output of a laser diode.

BACKGROUND OF THE INVENTION

A wavelength optical transmitter is an optical amplifier which amplifies light having a required wavelength band. Multiple wavelength optical transmitters are typically used in a system to transmit several laser signal lights over a single fiber. Each laser signal light represents a separate channel. It is critical that each laser signal light transmitted over a single fiber be on wavelength, otherwise they will interfere with each other. When two or more laser signal lights interfere with each other the light becomes a noise component and degrades the signal to noise ratio of the laser signal light. An optical wavelength filter is conventionally provided on the post-stage of the wavelength optical amplifier to prevent any laser signal lights from interfering with each other.

Another method used to stabilize the wavelength of the laser signal light is to improve the accuracy of the laser diode. However, improving the accuracy of the laser diode can be very expensive. To avoid these high costs, other methods for stabilizing the wavelength of a laser signal light are used. In one such method, a laser is first mounted to a thermoelectric cooler. A feedback control loop is then used to keep the thermister resistance of a thermoelectric cooler constant, thus holding the temperature of the laser transmitter constant. Since the laser transmitter temperature constant, the laser wavelength is stabilized. The above technique works well for optical transmitters requiring relatively constant output power, however, if the output power is varied, a simultaneous shift in the laser signal wavelength occurs causing interference with an adjoining channel.

SUMMARY OF THE INVENTION

The present invention provides a wavelength stabilizing system and method that substantially eliminates or reduces disadvantages and problems associated with previously developed wavelengths stabilizing systems and methods.

More specifically the present invention provides a system for minimizing the wavelength variation of the light output by a laser diode. The output power controlled stabilizing system and method includes a wavelength limiter which minimizes the wavelength variation of a laser signal light. The wavelength limiter comprises a first and second clamping circuit. The first clamping circuit receives an offset voltage, compares the offset voltage to a first predetermined reference voltage, and outputs the voltage difference between the offset voltage and the first predetermined reference voltage. If the offset voltage rises higher than the first predetermined reference voltage, the first clamping circuit clamps and keeps the output power of the output power controlled wavelength stabilizing system from increasing. The second clamping circuit also receives the offset voltage, compares the offset voltage to a second predetermined reference voltage, and outputs the voltage difference between the offset voltage and the second predetermined reference voltage. If the offset voltage drops below the second predetermined reference voltage, the second clamping circuit clamps and keeps the output power of the output power controlled wavelength stabilizing system from decreasing.

The present invention provides an important technical advantage by providing an output power controlled wavelength stabilizing system and method that reduces variation in output wavelength from a laser source due to changes in laser output power.

The present invention provides another important technical advantage by providing an output power controlled wavelength stabilizing system and method wherein the laser current can be prevented from changing faster than the thermoelectric cooler can compensate for changes in the output wavelength of a laser light signal. This can be done with minimal response time penalty by allowing the wavelength to drift within a pre-defined acceptable limit while temperature control changes are underway.

The present invention provides another important technical advantage by providing an output power controlled wavelength stabilizing system and method by providing a way to vary the output power and thus eliminate the need for a motor driven optical attenuator.

The present invention provides another important technical advantage by providing a system and method where the variation in wavelength is kept to a minimum even when the output power is varied over a large range.

BRIEF DESCRIPTION OF THE DRAWINGS

For a more complete understanding of the present invention and the advantages thereof, reference is now made to the following description taken in conjunction with the accompanying drawings in which like reference numerals indicate like features and wherein.

DETAILED DESCRIPTION OF THE INVENTION

Preferred embodiments of the present invention are illustrated in the FIGURES, like numerals being used to refer to like and corresponding parts of the various drawings.

The output power controlled wavelength stabilizing system provides a way for minimizing the wavelength variation at the output of a wavelength transmitter. The variation in wavelength of the laser signal light output from the wavelength transmitter can therefore be reduced or even minimized, even when the output power is varied over a large range. This is accomplished because the wavelength limiter can prevent the laser current from changing significantly faster than the temperature control circuit can compensate for the changes in output wavelength. For example, without this new solution, the output wavelength of a 1550 nanometer laser may vary as much as 0.5 nanometers when the output power changes from 0.5 milliwatts to 10 milliwatts. With the new solution, the wavelength limiter would allow the wavelength of the 1550 nanometer laser to vary only 0.01 nanometers and provide for a reduction in wavelength variance of 50 times less than previous solutions.

Figure 1:
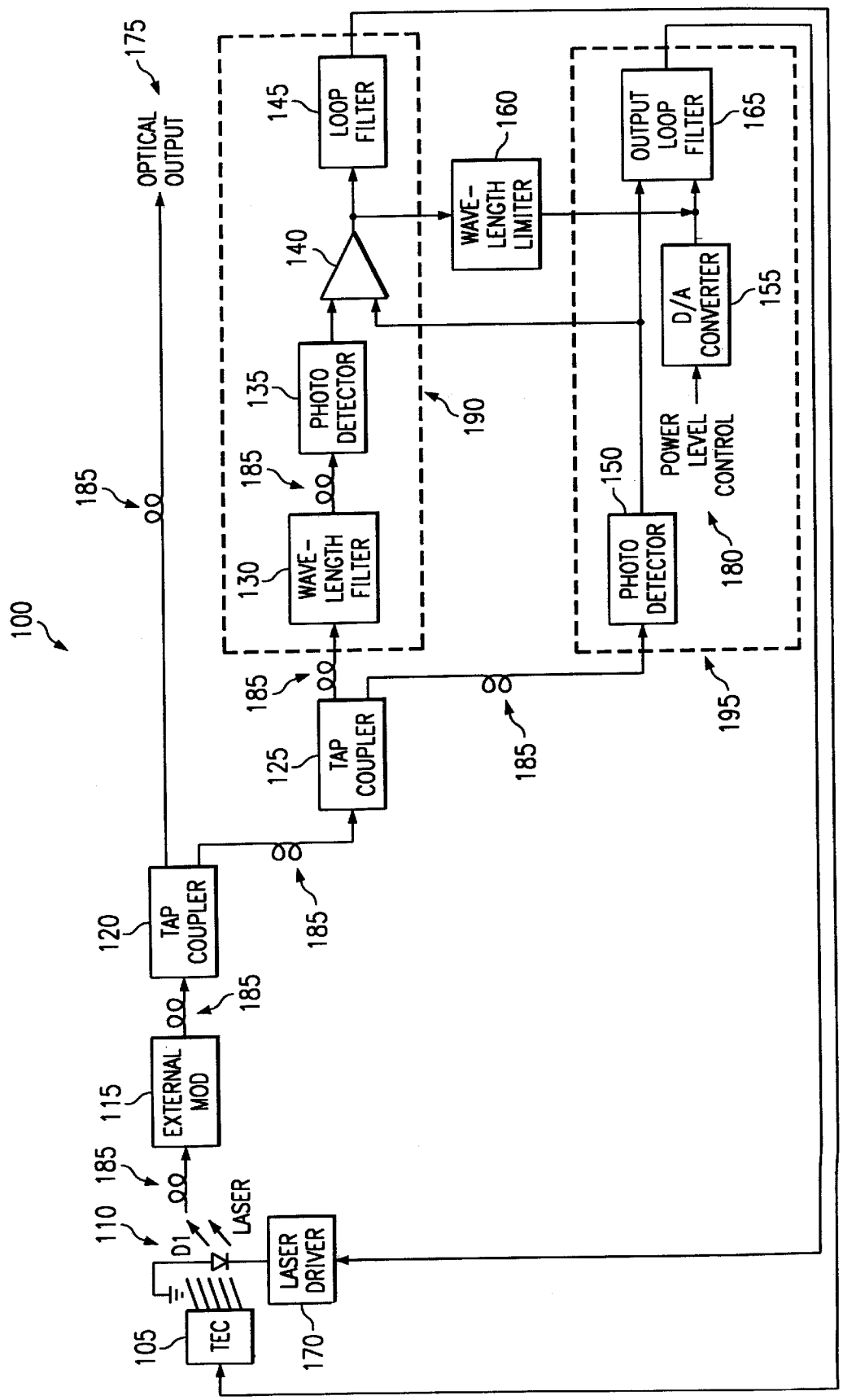
FIG. 1 shows a diagram of a wavelength optical transmitter incorporating an embodiment of the present invention that includes a thermoelectric cooler, a laser diode, a polarization maintaining fiber, an external modulator, a first tap coupler, an optical output, a second tap coupler, a thermoelectric feedback control circuit, a laser driver feedback control circuit, a wavelength limiter, and a laser driver.

FIG. 1 shows a precision wavelength transmitter incorporating an embodiment of the present invention having a wavelength stabilizing circuit 100 comprising a thermoelectric cooler 105, a laser diode 110, an external modulator 115, a polarization maintaining fiber 185, a first tap coupler 120, a second tap coupler 125, a thermoelectric feedback control circuit 190, a laser driver feedback control circuit 195, a wavelength limiter 160, a laser driver 170, and an optical output 175. The thermoelectric feedback control circuit 190 includes a wavelength filter 130, a first photodetector 135, a comparator 140, and a thermoelectric loop filter 145. The laser driver feedback control circuit 195 includes a second photodetector 150, a digital to analog converter 155, an output loop filter 165, and a power level controller 180.

The laser diode 110 emits a laser signal light into the polarization maintaining fiber 185 and through an external modulator 115. The polarization maintaining fiber 185 is necessary if an external modulator 115 is used. The external modulator 115 allows the laser signal light to be modulated outside the laser diode 110. If an external modulator 115 is not used, the laser signal light may be modulated at the laser driver 170 level.

Once the laser signal light is modulated, it is split into a first and second laser signal light component by a first tap coupler 120. A splitting ratio by the first tap coupler 120 may be appropriately set. For example, the first laser signal light component may comprise ninety-five percent of the laser signal light and the second laser signal light component may comprise five percent of the laser signal light. The first laser signal light component is output through the optical output 175. The second laser signal light component passes through the second tap coupler 125 and is split into a third and fourth laser signal light component. A splitting ratio by the second tap coupler 125 may also be appropriately set. For example, the third laser signal light component may comprise seventy percent of the laser signal light and the fourth laser signal light component may comprise thirty percent of the laser signal light.

The third laser signal light component is first input into the thermoelectric feedback control circuit 190. Within the thermoelectric feedback control circuit 190, the third laser signal light component passes through the wavelength filter 130 and is detected as a current by the first photo detector 135. The wavelength filter 130 is needed so that the laser current of the third laser signal light component will change with respect to wavelength. The wavelength filter 130 has a transmittance characteristic which continuously increases with a decrease in wavelength within a wavelength range, including a target wavelength of the laser diode 110. Alternatively, the wavelength filter 130 has a transmittance characteristic which continuously decreases with an increase in wavelength within a wavelength range. Thus, as the wavelength of the laser signal light is varied, the current detected by the first photodetector 135 either increases or decreases.

The fourth laser signal light component is first input into the laser driver feedback control circuit 195. Within the laser driver feedback control circuit 195, the fourth laser signal light component is detected as a current by the second photodetector 150. The current detected by the second photodetector 150 remains constant. The currents from the third and fourth laser signal light components detected by the first and second photodetectors are then converted into a second voltage and a first voltage respectively, and input into comparator 140. The fourth laser signal light component output from the second photodetector 150 also enters the output loop filter 165.

The comparator 140 compares the first voltage and the second voltage and outputs an offset voltage representing the difference between the first and second voltages. The offset voltage output from the comparator 140 passes into the thermoelectric cooler loop filter 145. The thermoelectric loop filter 145 includes a third resistor, a third capacitor and a third buffer all electrically connected together. When the offset voltage output from the comparator 140 equals zero, the laser signal light emitted from the laser diode 110 is on wavelength. However, when the offset voltage output from the comparator 140 is not equal to zero, the laser signal light emitted from the laser diode 110 is not on wavelength.

At the thermoelectric cooler loop filter 145, the offset voltage output from the comparator 140 is compared to a thermoelectric cooler loop filter reference voltage. The thermoelectric cooler loop filter 145 outputs the difference between the offset voltage output from the comparator and the thermoelectric cooler loop filter reference voltage, yielding an offset voltage. When the offset voltage output from the thermoelectric cooler loop filter is positive, the thermoelectric cooler 105 is cooling. If the offset voltage output from the thermoelectric cooler loop filter is negative, the thermoelectric cooler 105 is heating. The thermoelectric cooler 105 will either heat or cool the laser diode 110 until the laser signal light is back on wavelength.

The offset voltage output from the comparator 140 also passes into the wavelength limiter 160. The purpose of the wavelength limiter 160 is to prevent the laser current from changing faster than the thermoelectric cooler 105 can compensate for changes in the output wavelength. The voltage output from the wavelength limiter 160 serves a reference voltage for the output loop filter 165.

The output power level controller 180 is electrically connected to a digital to analog converter 155. The purpose of the power level controller 180 is to calibrate the output power of the output power controlled wavelength stabilizing system 100. The digital to analog converter 155 converts the digital input of the output level controller 180 into an output reference voltage for the output loop filter 165. Both the output from the wavelength limiter 160 and the output from the digital to analog converter 155 are input into the output loop filter 165.

The output loop filter 165 includes a fourth resistor, a fourth capacitor and a fourth buffer all electrically connected together. The purpose of the output loop filter 165 is to compare the first voltage output from the second photodetector 150 with the output loop filter 165 reference voltage, yielding an output loop filter 165 offset voltage. If the offset voltage from the output loop filter 165 is greater than zero, the output loop filter 165 offset voltage directs the laser driver 170 to drive the laser diode 110 through the laser driver feedback control circuit 195. As the laser diode 110 is driven, it heats up, thus causing the wavelength of the laser signal light to shift. If the output loop filter 165 offset voltage is less than zero, the offset voltage from the output loop filter 165 directs the laser driver 170 to quit driving the laser diode 110. Since the laser diode 110 is no longer being driven, it begins to cool causing the wavelength of the laser signal light to shift again.

Figure 2:
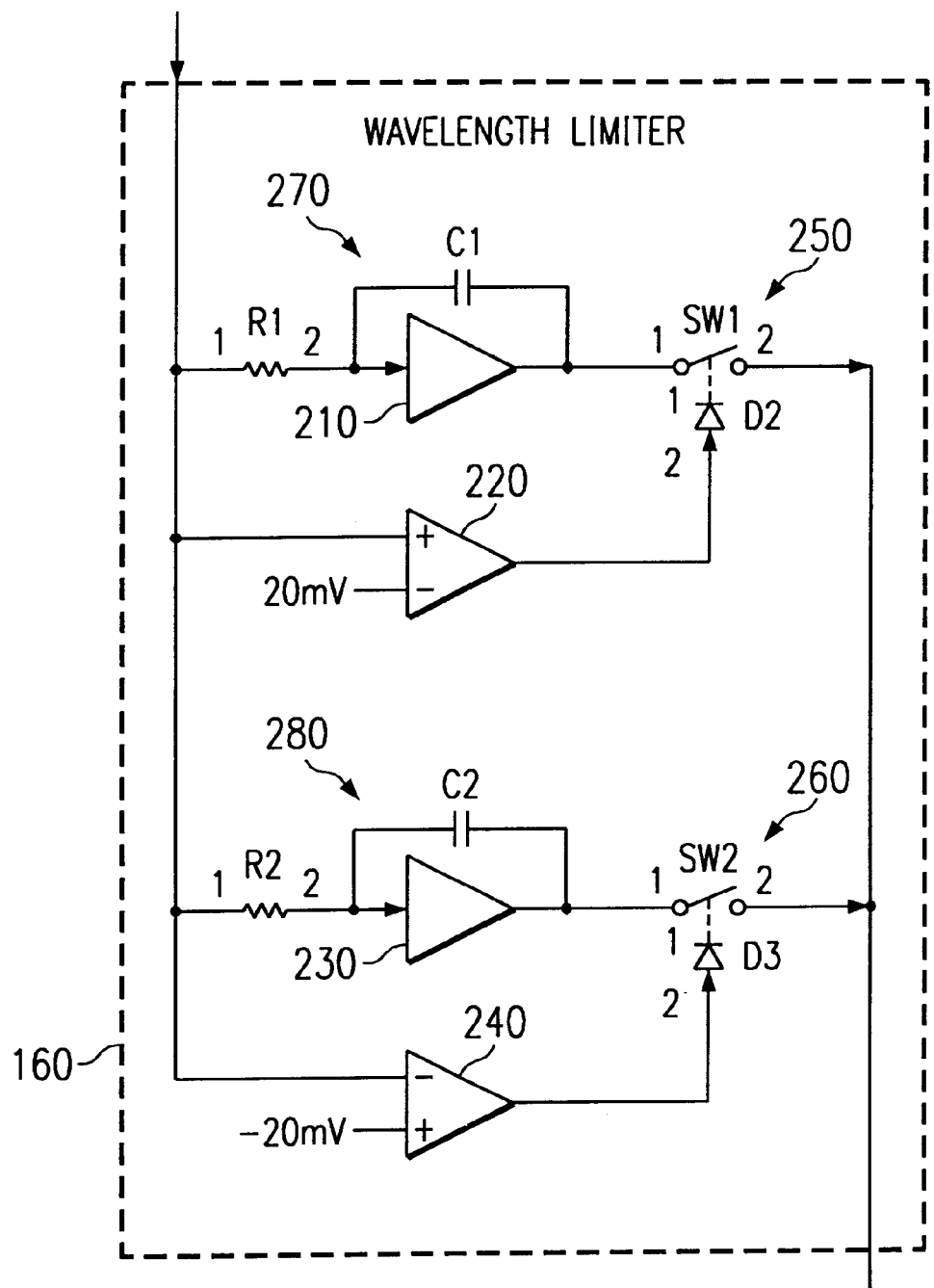
FIG. 2 shows a diagram of one embodiment of a wavelength limiter circuit according to the present invention comprising a first clamping circuit and a second clamping circuit.

FIG. 2 shows a detailed diagram of the wavelength limiter circuit 160. The purpose of the wavelength limiter circuit 160 is to prevent the laser current from changing significantly faster than the thermoelectric cooler 105 can compensate for changes in the wavelength of the laser signal light. The wavelength limiter circuit 160 includes a first clamping circuit 270 and a second clamping circuit 280 electrically connected in parallel. The first clamping circuit 270 includes a first resistor R1, a first capacitor C1, a first buffer 210, a first switch 250, a first comparator 220 and a first diode (D2) all electrically connected together. The second clamping circuit 280 includes a second resistor R2, a second capacitor C2, a second buffer 240, a second switch 260, a second comparator 230, and a second diode (D3) all electrically connected together.

With regard to both FIG. 1 and FIG. 2, following is a description of how the wavelength limiter circuit 160 operates when a positive offset voltage is input into the wavelength limiter circuit 160 from the comparator 140. Normally, when the offset voltage output from the comparator 140 is less than 20 mV, the voltage level at the output of buffer 220 is at 0 V. At this point, the diode D2 is reversed biased. When diode D2 is reversed biased, no current flows through diode D2, thus the wavelength limiter circuit 160 has no effect on the wavelength limiter's output voltage. However, once the output voltage from the output power level controller 180 rises, for example from 1 V to 2 V, the current level feeding into the laser driver 170 begins to rise and thus drives the laser diode 110. The rise in voltage and current as a result of varying the output level controller 180 causes the wavelength to shift. The wavelength filter 130 recognizes this shift in wavelength resulting in an offset voltage out of the comparator 140. The offset voltage output from the comparator 140 is then input into the wavelength limiter 160. Once the offset voltage feeding into the wavelength limiter 160 rises higher than the reference voltage of comparator 220 (for example, 20 mV), switch 1 250 closes, current begins to flow through diode D2, and the wavelength limiter circuit 160 is activated. The voltage output from the wavelength limiter 160 now serves as a reference voltage for the output loop filter 165. The low impedance of the wavelength limiter circuit 160 causes the voltage output from the digital to analog converter 155 to be ignored. When the offset voltage input into the wavelength limiter circuit 160 from the comparator 140 drops below the reference voltage of comparator 220, the wavelength limiter circuit 160 shuts down and the voltage output from the digital to analog converter 155 serves as the reference voltage of the output loop filter 165.

Referring again to both FIG. 1 and FIG. 2, following is a description of how the wavelength limiter circuit operates when a negative offset voltage is input into the wavelength limiter circuit 160 from the comparator circuit 140. Normally, when the offset voltage output from the comparator 140 is greater than −20 mV, the voltage level at the output buffer 240 is 0 V. At this point, the diode D3 is reversed biased. When diode D3 is reversed biased, no current flows through diode D3, thus the wavelength limiter circuit 160 has no effect on the output voltage of the wavelength limiter 160. However, once the output power level controller 180 is decreased so the offset voltage input into the wavelength limiter 160 drops below the reference voltage of comparator 240, the switch SW2 260 closes, current begins to flow through diode D3, and the wavelength limiter circuit 160 is activated. An example of the comparator 240 reference voltage can be −20 mV. The voltage output from the wavelength limiter 160 now serves as the reference voltage of the output loop filter 165. Again, the low impedance of the wavelength limiter 160 causes the voltage output from the digital to analog converter 155 to be ignored. The wavelength limiter circuit 160 acts as a clamping circuit. The wavelength limiter circuit 160 clamps until the desired output power level has been reached. Once the desired power level is reached, the thermoelectric cooler 105 eventually heats the laser diode 110 enough so that the offset voltage is increased to a point where the clamping circuit will open and stop sending requests for more power.

The output power controlled wavelength stabilizing system 100 is unique in that it utilizes a wavelength limiter 160 clamping circuit in combination with a thermoelectric cooler feedback control circuit 190 and laser driver feedback control circuit 195. In summary, the system and method for output power controlled stabilizing system comprises a wavelength limiter which minimizes the wavelength variation of a laser signal light. The wavelength limiter comprises a first and second clamping circuit. The first clamping circuit receives an offset voltage, compares the offset voltage to a first predetermined reference voltage, and outputs the voltage difference between the offset voltage and the first predetermined reference voltage. If the offset voltage rises higher than the first predetermined reference voltage, the first clamping circuit then clamps and keeps the power of the output power controlled wavelength stabilizing system from increasing. The second clamping circuit receives the offset voltage, compares the offset voltage to a second predetermined reference voltage, and outputs the voltage difference between the offset voltage and the second predetermined reference voltage. If the offset voltage drops below the second predetermined reference voltage, the second clamping circuit then clamps and keeps the power of the output power controlled wavelength stabilizing system from decreasing.

Although the present invention has been described in detail herein with reference to the illustrative embodiments, it should be understood that the description is by way of example only and is not to be construed in a limiting sense. It is to be further understood, therefore, that numerous changes in the details of the embodiments of this invention and additional embodiments of this invention will be apparent to, and may be made by, persons of ordinary skill in the art having reference to this description. It is contemplated that all such changes and additional embodiments are within the spirit and true scope of this invention as claimed below.

What is claimed is:

1. An output power controlled wavelength stabilizing system operable to minimize the wavelength variation of a laser signal light using a wavelength limiter, said wavelength limiter comprising:

a first clamping circuit, said first clamping circuit operable to:
 receive an offset voltage;
 compare said offset voltage to a first predetermined reference voltage of a first comparator;
 output the difference between said offset voltage and said first predetermined reference voltage yielding a first reference voltage; and
 clamp if said offset voltage rises higher than said first predetermined reference voltage; and a second clamping circuit, said second clamping circuit operable to:
 receive said offset voltage;
 compare said offset voltage to a second predetermined reference voltage of a second comparator;
 output the difference between said offset voltage and said second predetermined reference voltage yielding said first reference voltage; and
 clamp if said offset voltage drops below said second predetermined reference voltage.

2. The output power controlled wavelength stabilizing system of claim 1, wherein said first clamping circuit comprises:
   a first resistor;
   a first switch;
   a first buffer electrically connecting side two of said first resistor to side one of said first switch;
   a first capacitor electrically connecting side two of said first resistor to side one of said first switch;
   a first diode, side one of said first diode electrically connected to side two of said first switch; and
   said first comparator comprising a non-inverting input, an inverting input and an output, said non-inverting input of said first comparator electrically connected to side one of said first resistor and said output of said first comparator electrically connected to side two of said first diode.

3. The output power controlled wavelength stabilizing system of claim 1, wherein said second clamping circuit comprises:
   a second resistor;
   a second switch;
   a second buffer electrically connecting side two of said second resistor to side one of said second switch;
   a second capacitor electrically connecting side two of said second resistor to side one of said second switch;
   a second diode, side one of said second diode electrically connected to side two of said second switch; and
   said second comparator comprising a non-inverting input, an inverting input and an output, said non-inverting input of said second comparator electrically connected to side one of said second resistor and said output of said second comparator electrically connected to side two of said second diode.

4. The output power controlled wavelength stabilizing system of claim 1, further comprising:
   a laser diode operable to emit a laser signal light;
   a polarization maintaining fiber operable to receive and maintain the polarization of said laser signal light emitting from said laser diode;
   a thermoelectric cooler operable to heat or cool said laser diode;
   an external modulator operable to receive said laser signal light through said polarization maintaining fiber and modulate said laser signal light;
   a first tap coupler operable to receive said laser signal light from said external modulator and split said laser signal light into a first and second laser signal light component, said first laser signal light component output through an optical output;
   a second tap coupler operable to receive said second laser signal light component from said first tap coupler and split said second laser signal light component into a third and fourth laser signal light component;
   a laser driver feedback control circuit operable to direct said laser driver to drive said laser diode, said laser driver feedback control circuit comprising:
      a first photodetector operable to receive said fourth laser signal light component from said second tap coupler and detect the current value of said fourth laser signal light component, said first photodetector further operable to convert said current output from said first photodetector to a first voltage;
      a power level controller operable to calibrate the output power of said wavelength stabilizing system;
      a digital to analog converter operable to receive and convert the digital input from said power level controller to a first reference voltage; and
      an output loop filter operable to receive and compare the difference between said first reference voltage from said digital to analog converter or said wavelength limiter and said first voltage from said first photodetector yielding a first offset voltage, said first offset voltage operable to control the drive of said laser driver through said laser driver feedback control circuit;
   a laser driver operable to receive said first offset voltage from said output loop filter, said laser driver further operable to drive said laser diode; and
   a thermoelectric feedback control circuit operable to direct said thermoelectric cooler to either heat or cool said laser diode, said thermoelectric feedback control circuit comprising:
      a wavelength filter operable to receive said third laser signal light component, said wavelength filter having a transmittance characteristic which changes with wavelength;
      a second photodetector operable to receive said third laser signal light component from said wavelength filter and detect the current value of said third laser signal light component, said second photodetector further operable to convert said current output from said second photodetector into a second voltage;
      a third comparator operable to receive and compare said first voltage from said first photodetector with said second voltage from said second photodetector yielding a second offset voltage, said third comparator further operable to output said second offset voltage to said wavelength limiter; and
      a loop filter operable to receive and compare said second offset voltage from said third comparator with a second reference voltage yielding a third offset voltage, said third offset voltage operable to control said thermoelectric cooler through said thermoelectric feedback control circuit.

5. The output power controlled wavelength stabilizing system of claim 4, wherein said wavelength limiter allows the output power of said output power controlled wavelength stabilizing system to change as fast as said thermoelectric cooler can heat or cool said laser diode.

6. The output power controlled wavelength stabilizing system of claim 1, wherein a wavelength offset due to said wavelength variation determines how fast or slow the output power of said output power controlled wavelength stabilizing system may change.

7. The output power controlled wavelength stabilizing system of claim 6, wherein said wavelength offset is within a range of 0.5 nm or less.

8. The output power controlled wavelength stabilizing system of claim 4, wherein said laser diode, said thermoelectric cooler and said laser driver may each be obtained separately or together in an integrated package.

9. The output power controlled wavelength stabilizing system of claim 4, wherein said laser diode is a MOSFET.

10. The output power controlled wavelength stabilizing system of claim 4, wherein said laser diode is modulated directly eliminating the need for said external modulator and said polarization maintaining fiber.

11. The output power controlled wavelength stabilizing system of claim 4, wherein said first laser signal light component comprises ninety-five percent of said laser signal light and said second laser signal light component comprises five percent of said laser signal light.

12. The output power controlled wavelength stabilizing system of claim 4, wherein said third laser signal light component comprises seventy percent of said second laser signal light component and said fourth laser signal light component comprises thirty percent of said second laser signal light component.

13. The output power controlled wavelength stabilizing system of claim 4, wherein said wavelength filter has an adjustable heater to adjust the heat until said laser signal light reaches the desired wavelength.

14. The output power controlled wavelength stabilizing system of claim 4, wherein the polarity of said third offset voltage determines whether said thermoelectric cooler heats or cools said laser diode.

15. The output power controlled wavelength stabilizing system of claim 4, wherein said first reference voltage output from said digital to analog converter is varied using said power level controller.

16. The output power controlled wavelength stabilizing system of claim 1, wherein said first predetermined reference voltage can be 20 mV.

17. The output power controlled wavelength stabilizing system of claim 1, wherein said second predetermined reference voltage can be −20 mV.

18. The output power controlled wavelength stabilizing system of claim 2, wherein said first switch of said first clamping circuit opens when said second offset voltage is lower than said first predetermined reference voltage and closes when said second offset voltage rises above said first predetermined reference voltage.

19. The output power controlled wavelength stabilizing system of claim 3, wherein said second switch of said second clamping circuit opens when said second offset voltage is higher than said second predetermined reference voltage and closes when said second offset voltage drops below said second predetermined reference voltage.

20. An output power controlled wavelength stabilizing system comprising:
   a laser diode operable to emit a laser signal light;
   a polarization maintaining fiber operable to receive and maintain the polarization of said laser signal light emitting from said laser diode;
   a thermoelectric cooler operable to heat or cool said laser diode;
   an external modulator operable to receive said laser signal light through said polarization maintaining fiber and modulate said laser signal light;
   a first tap coupler operable to receive said laser signal light from said external modulator and split said laser signal light into a first and second laser signal light component, said first laser signal light component output through an optical output;
   a second tap coupler operable to receive said second laser signal light component from said first tap coupler and split said second laser signal light component into a third and fourth laser signal light component;
   a laser driver feedback control circuit operable to direct said laser driver to drive said laser diode, said laser driver feedback control circuit comprising:
      a first photodetector operable to receive said fourth laser signal light component from said second tap coupler and detect the current value of said fourth laser signal light component, said first photodetector further operable to convert said current output from said first photodetector to a first voltage;
   a power level controller operable to calibrate the output power of said wavelength stabilizing system;
   a digital to analog converter operable to receive and convert the digital input from said power level controller to a first reference voltage; and
   an output loop filter operable to receive and compare the difference between said first reference voltage from said digital to analog converter or said wavelength limiter and said first voltage from said first photodetector yielding a first offset voltage, said laser driver further operable to receive said first offset voltage from said output loop filter;
   a laser driver operable to receive said first offset voltage from said output loop filter, said laser driver further operable to drive said laser diode;
   a thermoelectric feedback control circuit operable to direct said thermoelectric cooler to either heat or cool said laser diode, said thermoelectric feedback control circuit comprising:
      a wavelength filter operable to receive said third laser signal light component, said wavelength filter having a transmittance characteristic which changes with wavelength;
      a second photodetector operable to receive said third laser signal light component from said wavelength filter and detect the current value of said third laser signal light component, said second photodetector further operable to convert said current output from said second photodetector into a second voltage;
      a third comparator operable to receive and compare said first voltage from said first photodetector with said second voltage from said second photodetector yielding a second offset voltage, said third comparator further operable to output said second offset voltage to said wavelength limiter; and
      a loop filter operable to receive and compare said second offset voltage from said third comparator with a second reference voltage yielding a third offset voltage; and
   a wavelength limiter operable to receive said second offset voltage from said comparator, minimize the wavelength variation of said laser signal light, and output said first reference voltage.

21. An output power controlled wavelength stabilizing method comprising the steps of:
   emitting laser signal light into a polarization maintaining fiber;
   splitting said laser signal light into a first and second laser signal light component;
   splitting said second laser signal light component of said laser signal light into a third and fourth laser signal light component;
   receiving said third laser signal light component at a thermoelectric cooler feedback control circuit;
   receiving an offset voltage at a wavelength limiter;
   using said wavelength limiter to minimize the variation of said laser signal light;
   outputting a first offset voltage from said thermoelectric cooler feedback control circuit to direct said thermoelectric cooler to either heat or cool a laser diode;
   calibrating the output power of said output power controlled wavelength transmitter by adjusting an output level controller;
   converting the digital input of said output power level controller into a voltage yielding a second reference voltage;
   minimizing the variation of said laser signal light wavelength by increasing or decreasing said output power level controller;

receiving said fourth laser signal light component at a laser driver feedback control circuit; and detecting the input voltage of said fourth laser signal light component;

outputting a reference voltage from said wavelength limiter to said laser driver feedback control circuit;

comparing the difference between said reference voltage against said input voltage, yielding a second offset voltage; and outputting said offset voltage from said laser driver feedback control circuit to direct said laser driver to drive said laser diode.

22. The output power controlled wavelength stabilizing method of claim 21, wherein said first laser signal light component consists of ninety-five percent of said laser signal light and said second laser signal light component consists of five percent of said laser signal light.

23. The output power controlled wavelength stabilizing method of claim 21, wherein said first laser signal light component of said laser signal light branches off to said optical output.

24. The output power controlled wavelength stabilizing method of claim 21, wherein said second laser signal light component of said laser signal light branches off to a second tap coupler.

25. The output power controlled wavelength stabilizing method of claim 21, wherein said third laser signal light component consists of seventy percent of said second laser signal light component and a fourth laser signal light component consists of thirty percent of said second laser signal light component.

26. The output power controlled wavelength stabilizing method of claim 21, wherein said wavelength limiter only permits the output power to change at the same rate that said thermoelectric cooler heats or cools said laser diode.

27. The output power controlled wavelength stabilizing method of claim 21, wherein a wavelength offset determines the rate at which the output power may change.

28. The output power controlled wavelength stabilizing method of claim 27, wherein said wavelength offset is a range of 0.5 nm or less.

29. The output power controlled wavelength stabilizing method of claim 21, wherein said laser diode, thermoelectric cooler and laser driver may each be obtained separately or in an integrated package.

30. The output power controlled wavelength stabilizing method of claim 21, wherein said laser diode is a MOSFET.

31. The output power controlled wavelength stabilizing method of claim 21, wherein the polarity of said first offset voltage determines whether said thermoelectric cooler heats or cools said laser diode.

* * * * *